United States Patent
Yoon et al.

(10) Patent No.: US 8,916,232 B2
(45) Date of Patent: Dec. 23, 2014

(54) METHOD FOR BARRIER INTERFACE PREPARATION OF COPPER INTERCONNECT

(75) Inventors: Hyungsuk Alexander Yoon, San Jose, CA (US); John Boyd, Hillsboro, OR (US); Yezdi Dordi, Palo Alto, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 889 days.

(21) Appl. No.: 11/639,050

(22) Filed: Dec. 13, 2006

(65) Prior Publication Data
US 2008/0057198 A1    Mar. 6, 2008

Related U.S. Application Data

(63) Continuation-in-part of application No. 11/514,038, filed on Aug. 30, 2006, now Pat. No. 8,241,701.

(51) Int. Cl.
*B05D 5/12*     (2006.01)
*C23C 18/16*    (2006.01)
(Continued)

(52) U.S. Cl.
CPC ........ *H01L 21/76843* (2013.01); *H01L 21/288* (2013.01); *H01L 21/32115* (2013.01);
(Continued)

(58) Field of Classification Search
USPC .............. 427/97.7, 97.8, 97.9, 98.1, 301; 438/627, 643, 653, 677, 687
See application file for complete search history.

(56) References Cited

U.S. PATENT DOCUMENTS 6,528,884 B1     3/2003   Lopatin et al.
(Continued)

FOREIGN PATENT DOCUMENTS

| JP | 2001-15517 | 1/2001 | .......... H01L 21/3205 |
| JP | 2001-023989 | 1/2001 | .......... H01L 21/3205 |

(Continued)

*Primary Examiner* — Brian K Talbot
(74) *Attorney, Agent, or Firm* — Martine Penilla Group, LLP

(57) ABSTRACT

The embodiments fill the need of improving electromigration and reducing stress-induced voids of copper interconnect by enabling deposition of a thin and conformal barrier layer, and a copper layer in the copper interconnect. The adhesion between the barrier layer and the copper layer can be improved by making the barrier layer metal-rich prior copper deposition and by limiting the amount of oxygen the barrier layer is exposed prior to copper deposition. Alternatively, a functionalization layer can be deposited over the barrier layer to enable the copper layer being deposit in the copper interconnect with good adhesion between the barrier layer and the copper layer. An exemplary method of preparing a substrate surface of a substrate to deposit a functionalization layer over a metallic barrier layer of a copper interconnect to assist deposition of a copper layer in the copper interconnect in an integrated system in order to improve electromigration performance of the copper interconnect is provided. The method includes depositing the metallic barrier layer to line the copper interconnect structure in the integrated system, wherein after depositing the metallic barrier layer, the substrate is transferred and processed in controlled environment to prevent the formation of metallic barrier oxide. The method also includes depositing the functionalization layer over the metallic layer in the integrated system. The method further includes depositing the copper layer in the copper interconnect structure in the integrated system after the functionalization layer is deposited over the metallic barrier layer.

30 Claims, 10 Drawing Sheets

(51) Int. Cl.
*H01L 21/00* (2006.01)
*H01L 21/288* (2006.01)
*H01L 21/321* (2006.01)
*H01L 21/67* (2006.01)
*H01L 21/768* (2006.01)
*H01L 21/3213* (2006.01)
*H01L 21/02* (2006.01)

(52) U.S. Cl.
CPC .... *H01L 21/67207* (2013.01); *H01L 21/76849* (2013.01); *H01L 21/32136* (2013.01); *H01L 21/76861* (2013.01); *C23C 18/1632* (2013.01); *H01L 21/02074* (2013.01); *H01L 21/32135* (2013.01); *H01L 21/7684* (2013.01); *H01L 21/76814* (2013.01); *H01L 21/76873* (2013.01); *H01L 21/02068* (2013.01); *H01L 21/76807* (2013.01); *H01L 21/0206* (2013.01); *H01L 21/76846* (2013.01); *H01L 21/02063* (2013.01); *H01L 21/321* (2013.01); *H01L 21/76862* (2013.01); *H01L 21/67161* (2013.01); *C23C 18/1653* (2013.01)
USPC ......... 427/97.7; 438/627; 438/643; 438/653; 438/677; 438/687; 427/97.8; 427/97.9; 427/98.1; 427/301

(56) References Cited

U.S. PATENT DOCUMENTS

| | | | |
|---|---|---|---|
| 6,686,278 B2 * | 2/2004 | Wang et al. | 438/672 |
| 7,211,509 B1 * | 5/2007 | Gopinath et al. | 438/650 |
| 2002/0142583 A1 * | 10/2002 | Chopra | 438/627 |
| 2002/0173144 A1 | 11/2002 | Yamamoto | 438/637 |
| 2004/0040504 A1 * | 3/2004 | Yamazaki et al. | 118/715 |
| 2004/0072419 A1 * | 4/2004 | Baskaran et al. | 438/627 |
| 2005/0079703 A1 * | 4/2005 | Chen et al. | 438/633 |
| 2005/0124154 A1 | 6/2005 | Park et al. | 438/643 |
| 2005/0215053 A1 * | 9/2005 | Soininen et al. | 438/658 |
| 2006/0024951 A1 * | 2/2006 | Schuehrer et al. | 438/627 |
| 2006/0108320 A1 * | 5/2006 | Lazovsky et al. | 216/2 |
| 2006/0121733 A1 | 6/2006 | Kilpela et al. | |
| 2006/0145351 A1 * | 7/2006 | Watkins et al. | 257/762 |
| 2006/0220249 A1 * | 10/2006 | Johnston et al. | 257/751 |
| 2006/0240187 A1 * | 10/2006 | Weidman | 427/248.1 |
| 2007/0099422 A1 * | 5/2007 | Wijekoon et al. | 438/687 |
| 2007/0281476 A1 * | 12/2007 | Lavoie et al. | 438/687 |

FOREIGN PATENT DOCUMENTS

| | | | | |
|---|---|---|---|---|
| JP | 2001-230252 | 8/2001 | ......... | H01L 21/3205 |
| JP | 2002-343796 | 11/2002 | ......... | H01L 21/3205 |
| JP | 2003-59861 | 2/2003 | ............ | H01L 21/28 |
| JP | 2005-513813 | 5/2005 | ......... | H01L 21/3205 |

* cited by examiner

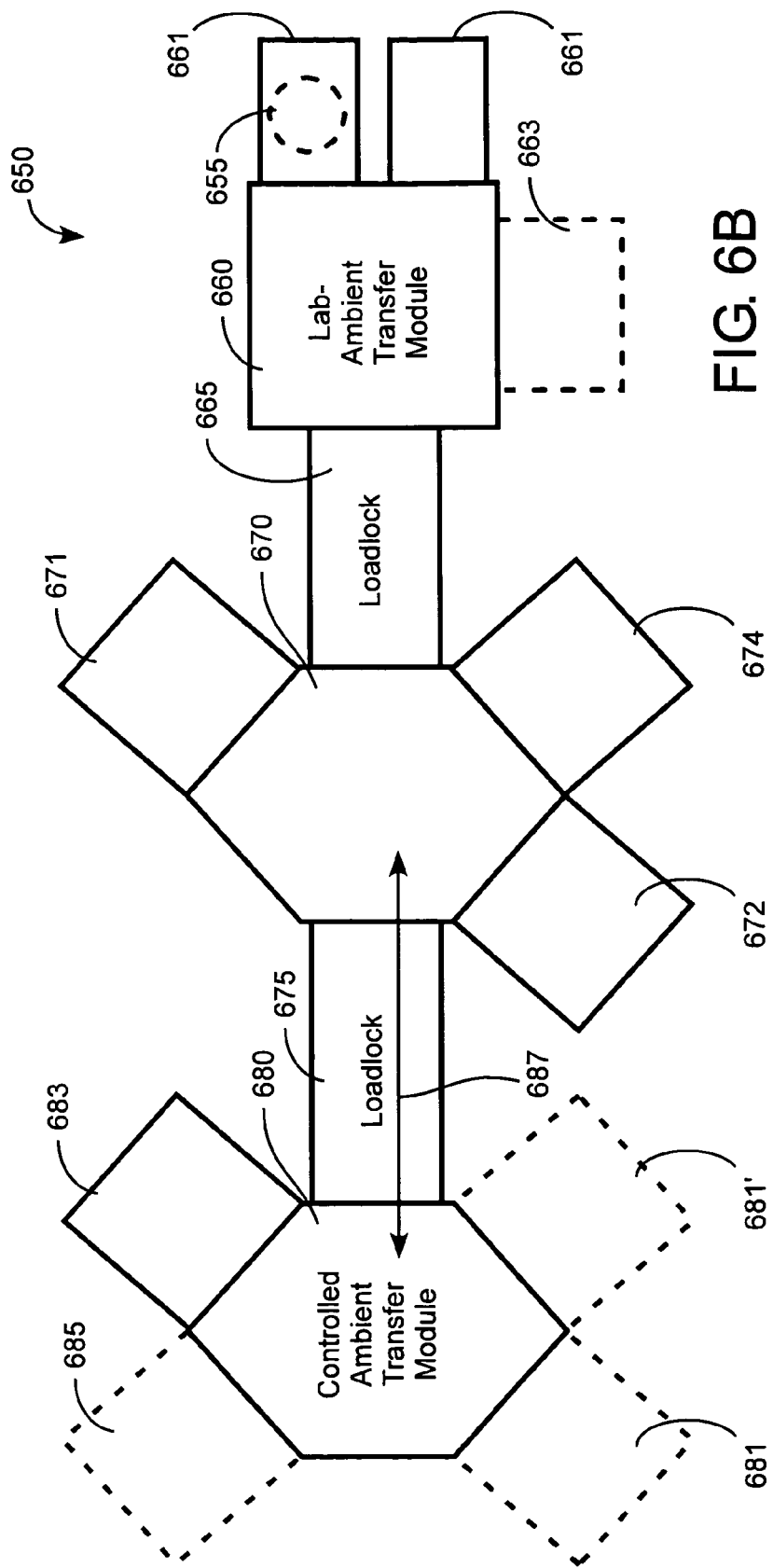

METHOD FOR BARRIER INTERFACE PREPARATION OF COPPER INTERCONNECT

CLAIM OF PRIORITY

This application is a continuation in part of U.S. application Ser. No. 11/514,038, titled "Processes and Systems for Engineering A Barrier Surface for Copper Deposition," filed on Aug. 30, 2006 now U.S. Pat. No. 8,241,701.

CROSS REFERENCE TO RELATED APPLICATION

This application is related to U.S. patent application Ser. No. 11/639,012 filed on the same date as this application, entitled "Self Assembled Monolayer for Improving Adhesion Between Copper and Barrier Layer." The disclosure of this related application is incorporated herein by reference in its entirety for all purposes.

BACKGROUND

Integrated circuits use conductive interconnects to wire together the individual devices on a semiconductor substrate, or to communicate externally to the integrated circuit. Interconnect metallization for vias and trenches may include aluminum alloys and copper. As device geometry continued to scale down to 65-nm-node technology and sub-65-nm technology, the requirement of continuous barrier/seed layer with good step coverage along high aspect ratio geometry to provide void free copper filling becomes challenging. The motivation to go to ultra thin and conformal barrier in 65-nm-node or sub-65-nm-technology is to reduce the barrier's impact on via and line resistance. However, poor adhesion of copper to the barrier layer could cause delamination between the barrier layer and copper during processing or thermal stressing that poses a concern on electro-migration and stress-induced voiding.

In view of the foregoing, there is a need for systems and processes that enable deposition of a thin and conformal barrier layer, and a copper layer in the copper interconnect with good electro-migration performance and with reduced risk of stress-induce voiding of copper interconnect.

SUMMARY

Broadly speaking, the embodiments fill the need enabling deposition of a thin and conformal barrier layer, and a copper layer in the copper interconnect with good electro-migration performance and with reduced risk of stress-induce voiding of copper interconnect. Electromigration and stress-induced voiding are affected by the adhesion between the barrier layer and the copper layer, which can be improved by making the barrier layer metal-rich prior copper deposition and by limiting the amount of oxygen the barrier layer is exposed prior to copper deposition. Alternatively, a functionalization layer can be deposited over the barrier layer to enable the copper layer being deposit in the copper interconnect. The functionalization layer forms strong bonds with barrier layer and with copper to improve adhesion property between the two layers. The functionalization layer can also merely enable the deposition of copper over the barrier layer and be replaced by the copper layer. It should be appreciated that the present invention can be implemented in numerous ways, including as a solution, a method, a process, an apparatus, or a system. Several inventive embodiments of the present invention are described below.

In one embodiment, a method of preparing a substrate surface of a substrate to deposit a functionalization layer over a metallic barrier layer of a copper interconnect to assist deposition of a copper layer in the copper interconnect in an integrated system in order to improve electromigration performance of the copper interconnect is provided. The method includes depositing the metallic barrier layer to line the copper interconnect structure in the integrated system, wherein after depositing the metallic barrier layer, the substrate is transferred and processed in controlled environment to prevent the formation of metallic barrier oxide. The method also includes depositing the functionalization layer over the metallic layer in the integrated system. The method further includes depositing the copper layer in the copper interconnect structure in the integrated system after the functionalization layer is deposited over the metallic barrier layer.

In another embodiment, an integrated system for processing a substrate in controlled environment to enable deposition of a functionalization layer over a metallic barrier layer of a copper interconnect to improve electromigration performance of the copper interconnect is provided. The system includes a lab-ambient transfer chamber capable of transferring the substrate from a substrate cassette coupled to the lab-ambient transfer chamber into the integrated system. The system also includes a vacuum transfer chamber operated under vacuum at a pressure less than 1 Torr. The system further includes a vacuum process module for depositing the metallic barrier layer, wherein the vacuum process module for depositing the metallic barrier layer is coupled to the vacuum transfer chamber, and is operated under vacuum at a pressure less than 1 Torr. In addition, the system includes a controlled-ambient transfer chamber filled with an inert gas selected from a group of inert gases, and a deposition process module used to deposit the functionalization layer on the surface of the metallic barrier layer, wherein the deposition process module used to deposit the functionalization layer is coupled to the controlled-ambient transfer chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 6B shows an exemplary integrated system used to process a substrate using a process flow of FIG. 6A.

DETAILED DESCRIPTION OF THE EXEMPLARY EMBODIMENTS

Several exemplary embodiments for improved metal integration techniques that remove interfacial metal oxide by reduction or add an adhesion-promoting layer to improve interface adhesion and to lower the resistivity of metal interconnect are provided. It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

Figure 1A:
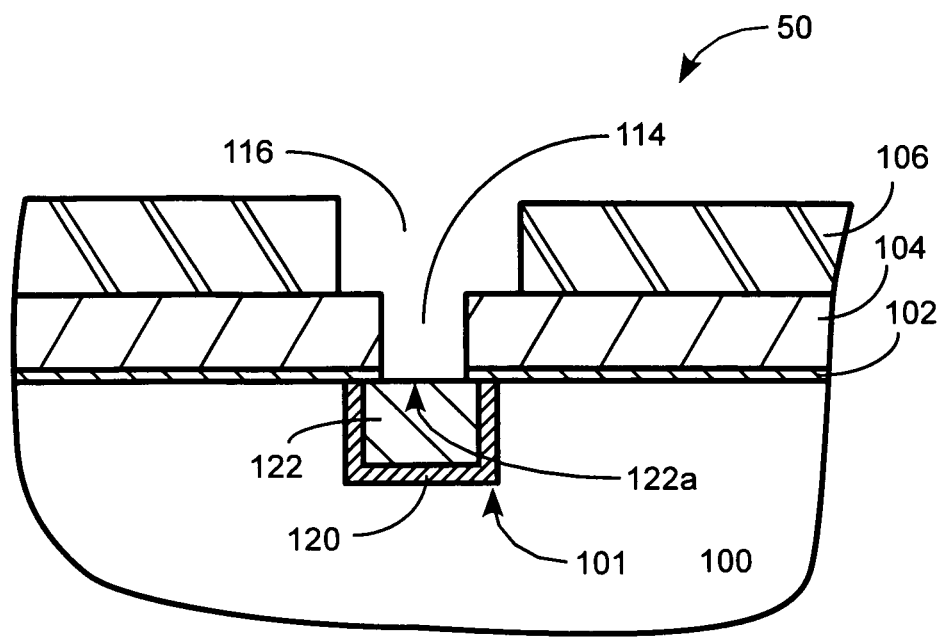
FIGS. 1A-1D show cross sections of a dual-damascene interconnect structure at various stages of interconnect processing.

FIG. 1A shows an exemplary cross-section of an interconnect structure(s) after being patterned by using a dual damascene process sequence. The interconnect structure(s) is on a substrate 50 and has a dielectric layer 100, which was previously fabricated to form a metallization line 101 therein. The metallization line is typically fabricated by etching a trench into the dielectric 100 and then filling the trench with a conductive material, such as copper.

In the trench, there is a barrier layer 120, used to prevent the copper material 122, from diffusing into the dielectric 100. The barrier layer 120 can be made of physical vapor deposition (PVD) tantalum nitride (TaN), PVD tantalum (Ta), atomic layer deposition (ALD) TaN, or a combination of these films. Other barrier layer materials can also be used. A barrier layer 102 is deposited over the planarized copper material 122 to protect the copper material 122 from premature oxidation when via holes 114 are etched through overlying dielectric materials 104, 106 to the barrier layer 102. The barrier layer 102 is also configured to function as a selective etch stop. Exemplary barrier layer 102 materials include silicon nitride (SiN) or silicon carbide (SiC).

A via dielectric layer 104 is deposited over the barrier layer 102. The via dielectric layer 104 can be made of an organosilicate glass (OSG, carbon-doped silicon oxide) or other types of dielectric materials, preferably with low dielectric constants. Exemplary silicon dioxides can include, a PECVD un-doped TEOS silicon dioxide, a PECVD fluorinated silica glass (FSG), a HDP FSG, OSG, porous OSG, etc. and the like. Commercially available dielectric materials including Black Diamond (I) and Black Diamond (II) by Applied Materials of Santa Clara, Calif., Coral by Novellus Systems of San Jose, Aurora by ASM America Inc. of Phoenix, Ariz., can also be used. Over the via dielectric layer 104 is a trench dielectric layer 106. The trench dielectric layer 106 may be a low K dielectric material, such as a carbon-doped oxide (C-oxide). The dielectric constant of the low K dielectric material can be about 3.0 or lower. In one embodiment, both the via and trench dielectric layers are made of the same material, and deposited at the same time to form a continuous film. After the trench dielectric layer 106 is deposited, the substrate 50 that holds the structure(s) undergoes patterning and etching processes to form the vias holes 114 and trenches 116 by known art.

Figure 1B:
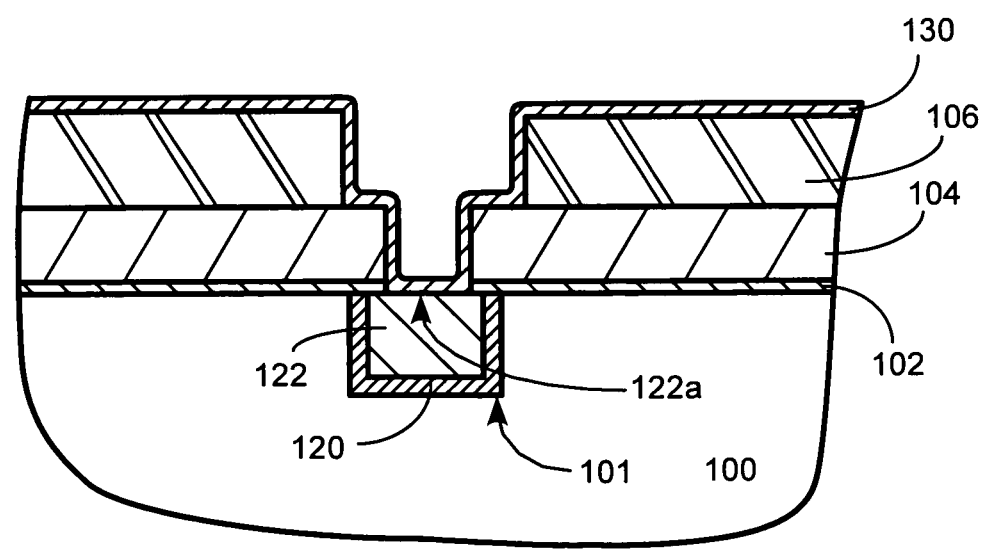

FIG. 1B shows that after the formation of vias holes 114 and trenches 116, a barrier layer 130 and a copper layer 132 are deposited to line and fill the via holes 114 and the trenches 116. The barrier layer 130 can be made of tantalum nitride (TaN), tantalum (Ta), Ruthenium (Ru), or a hybrid combination of these materials. While these are the commonly considered materials, other barrier layer materials can also be used. Barrier layer materials may be other refractory metal compound including but not limited to titanium (Ti), tungsten (W), zirconium (Zr), hafnium (Hf), molybdenum (Mo), niobium (Nb), vanadium (V), ruthenium (Ru) and chromium (Cr), among others.

Figure 1C:
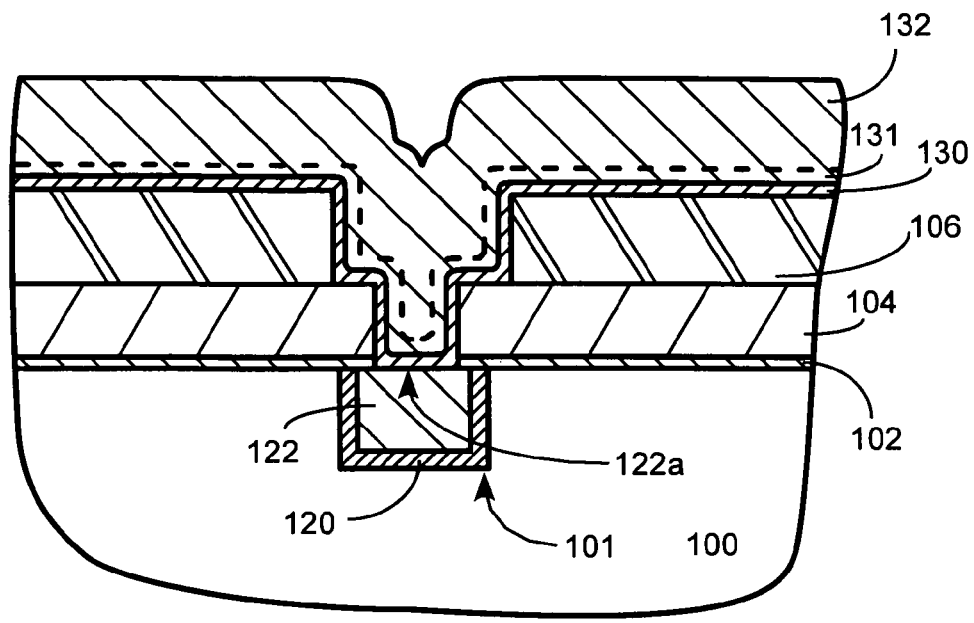

A copper film 132 is then deposited to fill the via holes 114 and the trenches 116, as shown in FIG. 1C. In one embodiment, the copper film 132 includes a thin copper seed layer 131 underneath. In one embodiment, the thickness of the thin copper seed layer is between about 5 angstroms to about 300 angstroms.

Barrier layer, such as Ta, TaN or Ru, if exposed to air for extended period of time, can form $Ta_xO_y$ (Tantalum oxide), $TaO_xN_y$ (Tantalum oxynitride), or $RuO_2$ (Ruthenium oxide). Electroless deposition of a metal layer on a substrate is highly dependent upon the surface characteristics and composition of the substrate. Electroless plating of copper on a Ta, TaN, or Ru surface is of interest for both seed layer formation prior to electroplating, and selective deposition of Cu lines within lithographically defined pattern(s). One concern is the inhibition of the electroless deposition process by atomically thin native metal oxide layer formed in the presence of oxygen ($O_2$).

In addition, copper film does not adhere to the barrier oxide layer, such as tantalum oxide, tantalum oxynitride, or ruthenium oxide, as well as it adheres to the pure barrier metal or barrier-layer-rich film, such as Ta, Ru, or Ta-rich TaN film. Ta and/or TaN barrier layers are only used as examples. The description and concept apply to other types of barrier metals, such as Ta or TaN capped with a thin layer of Ru. As described above, poor adhesion can negatively affect the EM performance. In addition, the formation tantalum oxide or tantalum oxynitride on the barrier layer surface can increase the resistivity of the barrier layer. Due to these issues, it is desirable to use the integrated system to prepare the barrier/copper interface to ensure good adhesion between the barrier layer and copper and to ensure low resistivity of the barrier layer.

Figure 1D:
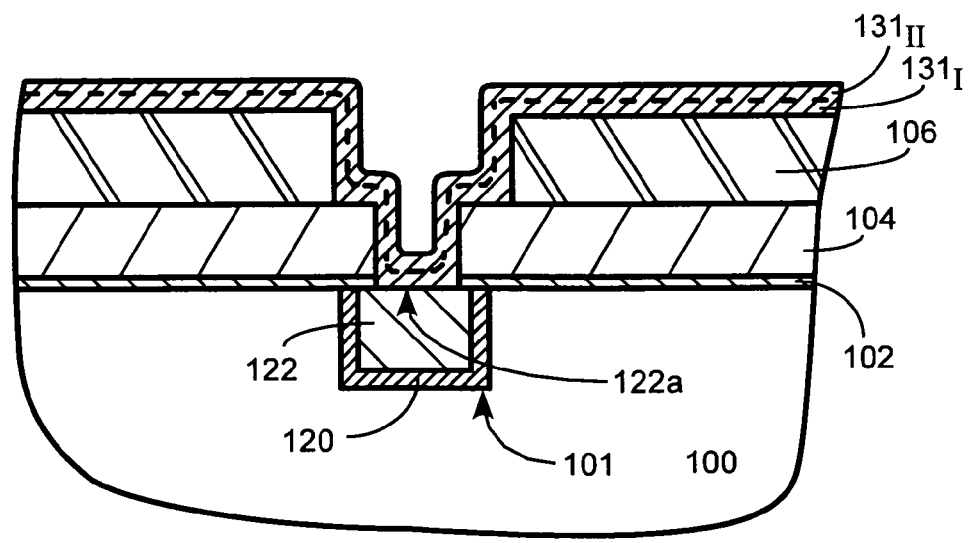

FIG. 1B shows that the barrier layer 130 is a single layer deposited either by ALD or PVD. Alternatively, the barrier layer 130 can be deposited by an ALD process to deposit a first barrier layer 130$_I$, such as TaN, which is followed by a PVD second barrier layer 130$_{II}$, such as Ta, as shown in FIG. 1D.

Figure 2A:
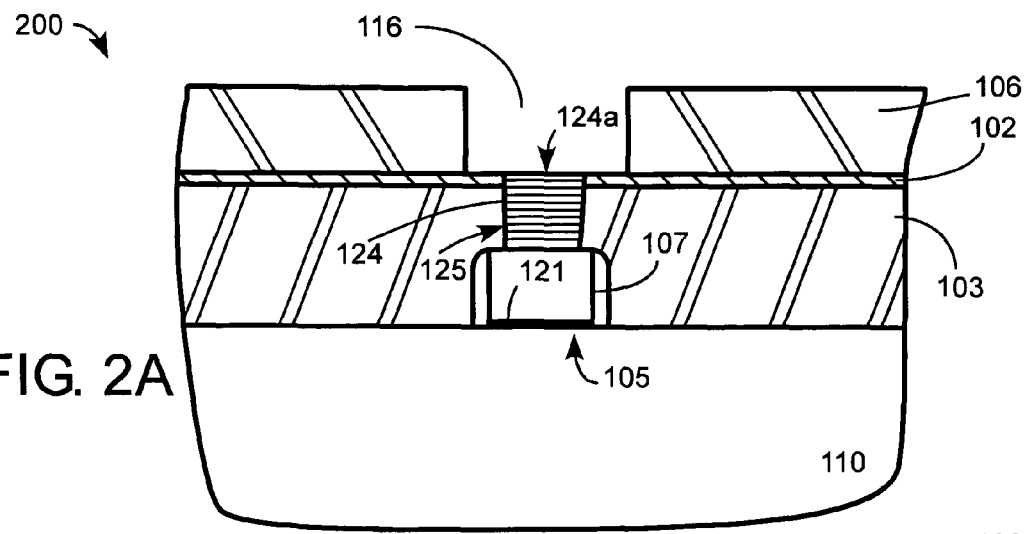
FIGS. 2A-2C show cross sections of a metal line structure at various stages of interconnect processing.

In addition to dual-damascene interconnect structures, copper interconnect can also be applied to metal lines (or M1 lines) over contacts. FIG. 2A shows an exemplary cross-section of a metal line structure after being patterned by a dielectric etch and being removed of photoresist. The metal line structure(s) is on a substrate 200 and has a silicon layer 110, which was previously fabricated to form a gate structure 105 with a gate oxide 121, spacers 107 and a contact 125 therein. The contact 125 is typically fabricated by etching a contact hole into the oxide 103 and then filling the contact hole with a conductive material 124, such as tungsten. Alternative materials may include copper, aluminum or other conductive materials. The barrier layer 102 is configured to function as a selective trench etch stop. The barrier layer 102 can be made of materials such as silicon nitride (SiN) or silicon carbide (SiC).

Figure 2B:
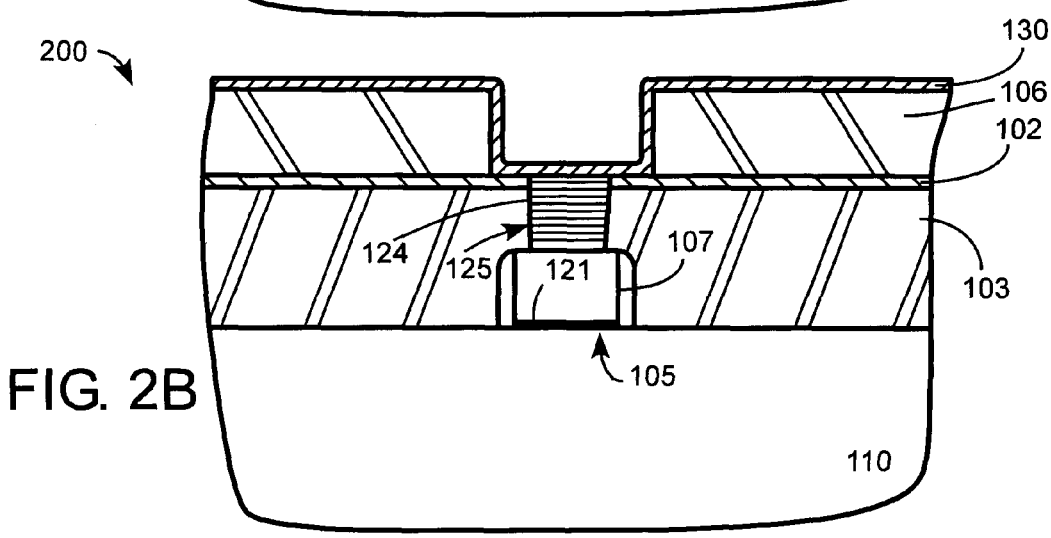
Figure 2C:
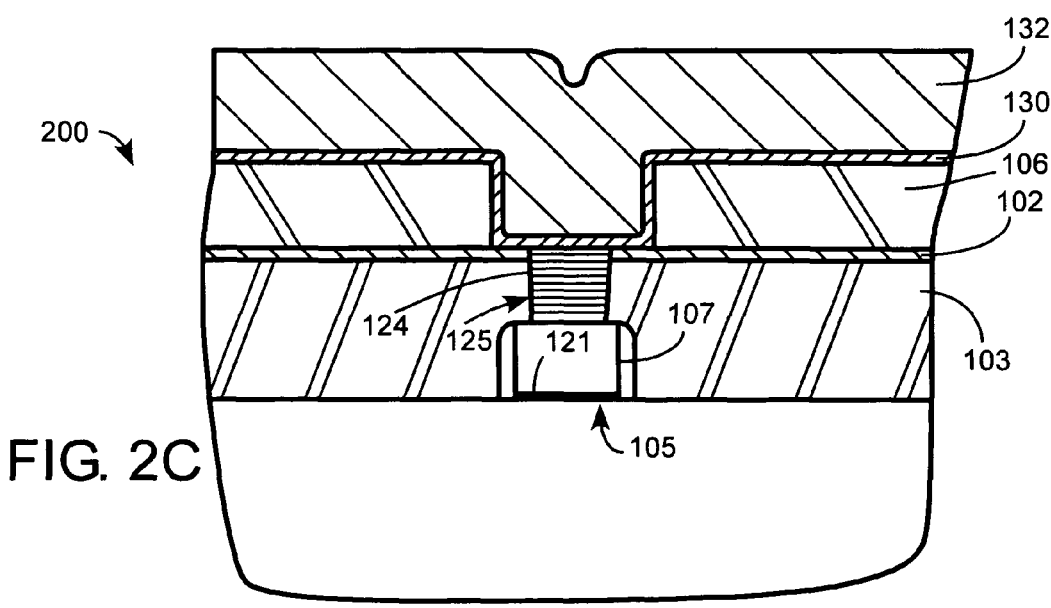

A dielectric layer 106 is deposited over the barrier layer 102. The dielectric materials that can be used to deposit dielectric layer 106 have been described above. After the deposition of dielectric layer 106, the substrate is patterned and etched to create metal trenches 116. FIG. 2B shows that after the formation of metal trenches 116, a metallic barrier layer 130 is deposited to line metal trench 116. FIG. 2C shows that after the barrier layer 130 is deposited, a copper layer 132 is deposited over the barrier layer 130. Similar to the dual-damascene interconnect structures, the barrier layer 130 can be made of tantalum nitride (TaN), tantalum (Ta), Ru, or a combination of these films. A copper film 132 is then deposited to fill the metal trench 116.

As described above for dual-damascene structures, barrier layer, such as Ta, TaN or Ru, if exposed to air for extended period of time, can form $Ta_xO_y$ (Tantalum oxide), $TaO_xN_y$ (Tantalum oxynitride), or $RuO_2$ (Ruthenium oxide). Electroless deposition of a metal layer on a substrate is highly dependent upon the surface characteristics and composition of the substrate. Electroless plating of copper on a Ta, TaN, or Ru surface is of interest for both seed layer formation prior to electroplating, and selective deposition of Cu lines within lithographically defined pattern(s). As described above, the concern is the inhibition of the electroless deposition process by atomically thin native metal oxide layer formed in the presence of oxygen ($O_2$). In addition, copper film does not adhere to the barrier oxide layer, such as tantalum oxide, tantalum oxynitride, or ruthenium oxide, as well as it adheres to the pure barrier metal or barrier-layer-rich film, such as Ta, Ru, or Ta-rich TaN film. As described above, poor adhesion can negatively affect the EM performance. The formation tantalum oxide or tantalum oxynitride on the barrier layer surface can also increase the resistivity of the barrier layer. Due to these issues, it is desirable to use the integrated system to prepare the barrier/copper interface to ensure good adhesion between the barrier layer and copper and to ensure low resistivity of the barrier layer.

Figure 3A:
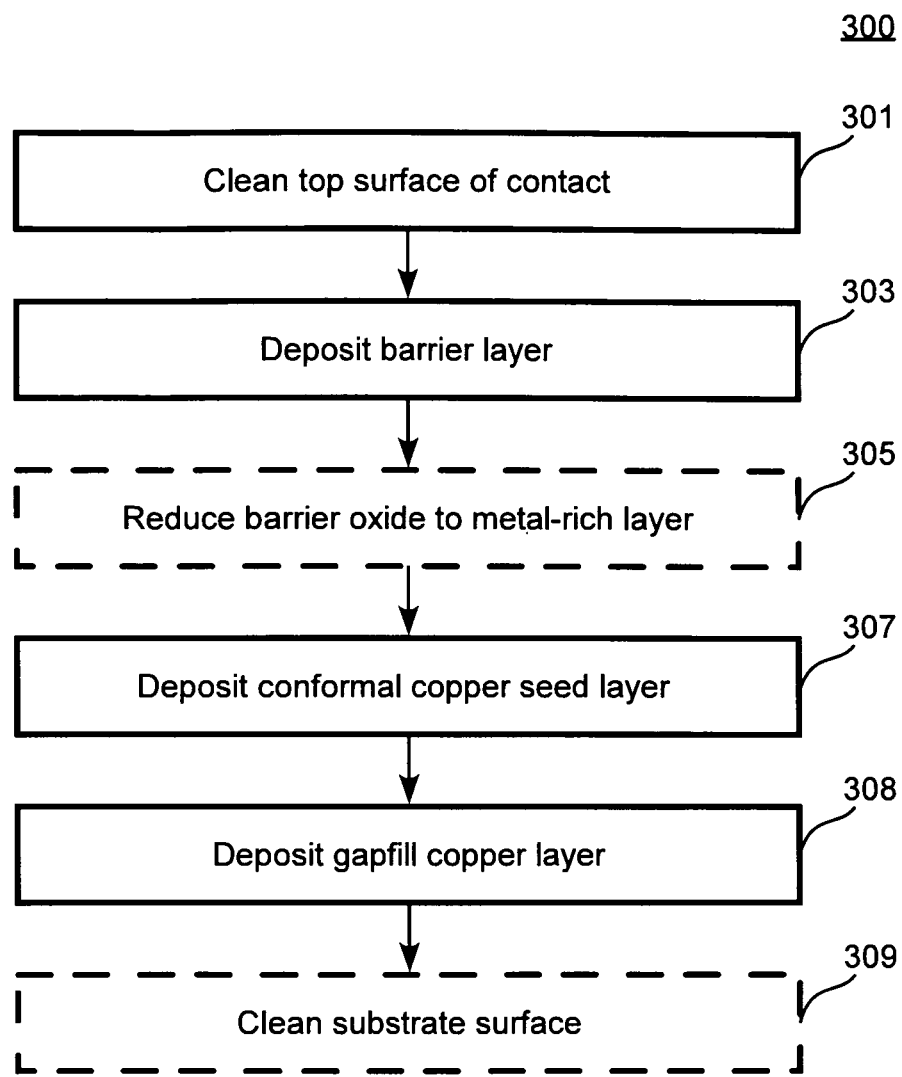
FIG. 3A shows an exemplary process flow of interconnect processing.

FIG. 3A shows an embodiment of a process flow 300 of preparing a barrier (or liner) layer surface for electroless copper deposition after the trenches, such as trenches 116 of FIG. 2A) have been formed. Forming metal trench interconnect over contact plugs, as shown in FIG. 2A-2C, is merely used as an example. The concept of the invention can also be used to form dual-damascene interconnect structures over metal trenches, such as the ones shown in FIGS. 1A-1D, or other applicable interconnect structures. It should be noted, however, that the barrier (or liner) layer may be prepared separately in a non-integrated deposition system, such as an ALD or PVD deposition reactor. In this case, the surface preparation for depositing a thin copper seed layer would not include the metal plug preclean and barrier deposition process steps. At step 301, the top surface 124a of the contact plug is cleaned to remove native metal oxide. Metal oxide can be removed by an Ar sputtering process, a plasma process using a fluorine-containing gas, such as $NF_3$, $CF_4$, or a combination of both, a wet chemical etch process, or a reduction process, for example using a hydrogen-containing plasma. Metal oxide can be removed by a wet chemical removal process in a 1-step or a 2-step wet chemical process sequence. The wet chemical removal process can use an organic acid, such as DeerClean offered by Kanto Chemical Co., Inc. of Japan or a semi-aqueous solvent, such as ESC 5800 offered by DuPont of Wilmington, Del., an organic base such as tetramethylammonium chloride (TMAH), complexing amines such as ethylene diamine, diethylene triamine, or proprietary chemistry such as ELD clean and Cap Clean 61, provided by Enthone, Inc. of West Haven, Conn. In addition, metal oxides, specifically copper oxide, can be removed using a weak organic acid such as citric acid, or other organic or inorganic acids can be used. Additionally, very dilute (i.e. <0.1%) peroxide-containing acids, such as sulfuric-peroxide mixtures, can also be used.

At step 303, a barrier layer is deposited. Due to the shrinking metal line and via critical dimension, the barrier layer may be deposited by atomic layer deposition (ALD), depending on the technology node. The thickness of the barrier layer 130 is between about 20 angstroms to about 200 angstroms. As described above, preventing the barrier layer from exposure to oxygen is critical in ensuring that electroless copper is being deposited on the barrier layer with good adhesion between copper and the barrier layer. Once the barrier layer is deposited, the substrate should be transferred or processed in a controlled-ambient environment to limit exposure to oxygen. In one embodiment, the barrier layer is hydrogen-plasma treated to produce a metal-rich surface on the barrier layer, such as Ta, TaN, or Ru, at step 305 to provide a catalytic surface for the subsequent copper seed deposition step. The reducing plasma can include gas, such as hydrogen or ammonia. The reducing plasma can include an inert gas, such as Ar, or He. Step 305 is an optional step, if the barrier surface is metal-rich after barrier layer deposition, such as the deposited barrier layer is a tantalum or ruthenium layer, the surface reduction step is not required. On the other hand, if the barrier layer deposited is a barrier nitride layer, such as TaN, or if the barrier layer is exposed to oxygen, the hydrogen-plasma treatment (or reduction) would be needed. Whether this step is needed or not depends on how metal-rich the surface is.

Afterwards, conformal copper seed is deposited on the barrier surface at step 307, followed by a thick copper gap fill (or bulk fill) process, 308. In one embodiment, the conformal copper seed layer can be deposited by an electroless process. The thick copper bulk fill process can be an electroless deposition (ELD) process or an electrochemical plating (ECP) process. Electroless copper deposition and ECP are well-known wet process. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen. The electroless deposition process can be carried out in a number of ways, such as puddle-plating, where fluid is dispensed onto a substrate and allowed to react in a static mode, after which the reactants are removed and discarded, or reclaimed. Recently, a dry-in/dry-out electroless copper process has been developed. The process uses a proximity process head to limit the electroless process liquid in contacting with the substrate surface on a limited region. The substrate surface not under the proximity process head is dry. Details of such process and system can be found in U.S. application Ser. No. 10/607,611, titled "Apparatus And Method For Depositing And Planarizing Thin Films On Semiconductor Wafers," filed on Jun. 27, 2003, and U.S. application Ser. No. 10/879,263, titled "Method and Apparatus For Plating Semiconductor Wafers," filed on Jun. 28, 2004, both of which are incorporated herein in their entireties. Further, all fluids used in the process are de-gassed, i.e. dissolved oxygen is removed by commercially available degassing systems.

After copper deposition at steps 307 and 308, the substrate can undergo an optional substrate cleaning at step 309. Post-copper-deposition clean can be accomplished by using a brush scrub clean with a chemical solution, such as a solution containing CP72B supplied by Air Products and Chemical, Inc. of Allentown, Pa. Other substrate surface cleaning processes can also be used, such as Lam's C3™ or AMC™ (Advanced Mechanical Clean) cleaning technology.

Figure 3B:
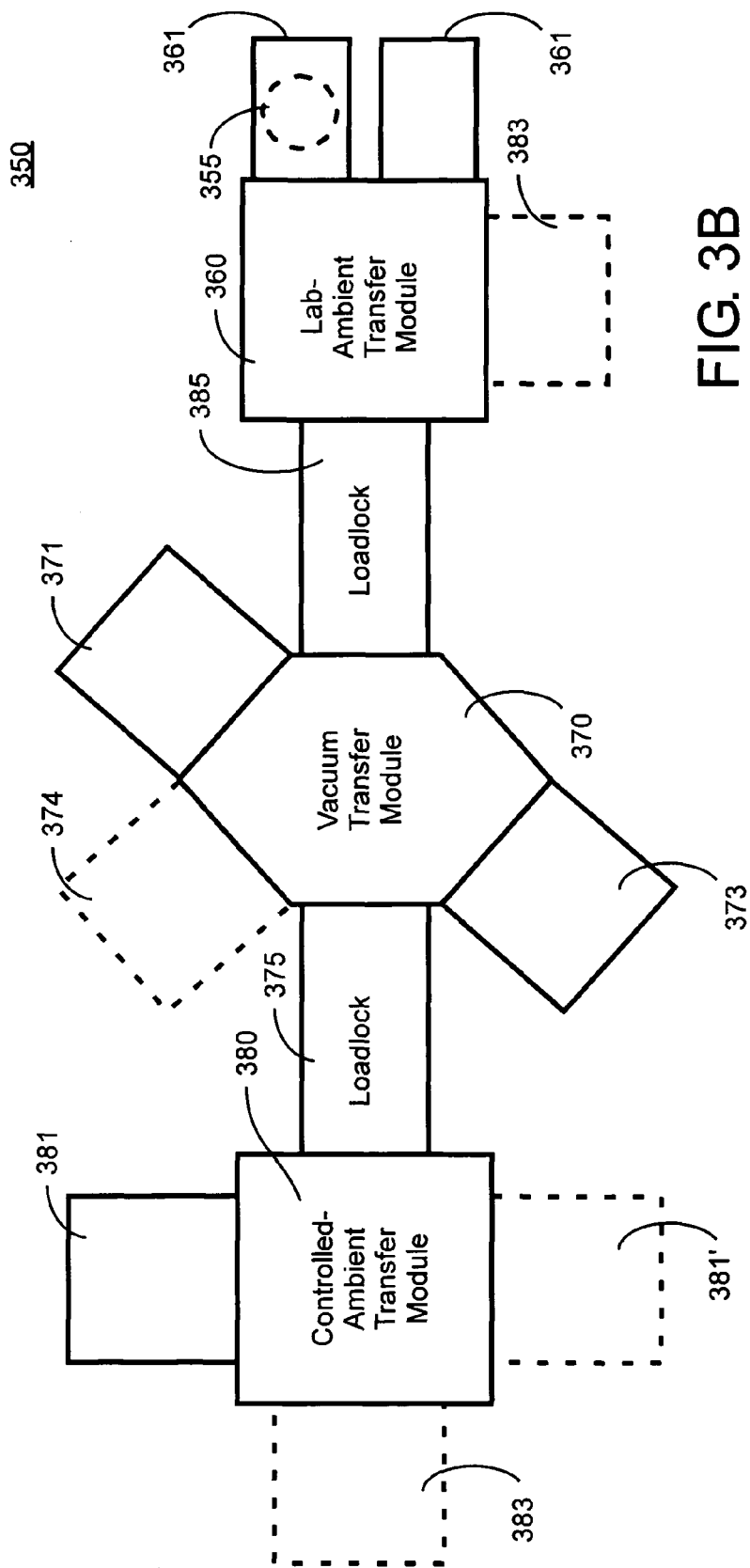
FIG. 3B shows an exemplary integrated system used to process a substrate using a process flow of FIG. 3A.

FIG. 3B shows an embodiment of a schematic diagram of an integrated system 350 that allows minimal exposure of substrate surface to oxygen at critical steps after barrier surface preparation. In addition, since it is an integrated system, the substrate is transferred from one process station immediately to the next process station, limiting the duration that clean barrier surface is exposed to low levels of oxygen. The integrated system 350 can be used to process substrate(s) through the entire process sequence of flow 300 of FIG. 3A.

As described above, the surface preparation for electroless deposition of copper involves a mixture of dry and wet processes. The wet processes are typically operated near atmosphere, while the dry plasma processes are operated at less than 1 Torr. In addition, after the barrier layer has been deposited, the substrate should be exposed to oxygen as little as possible, which can be achieved by being transferred and processed in controlled environment. Therefore, the integrated system needs to be able to handle a mixture of dry and wet processes. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen. The integrated system 350 has 3 substrate transfer modules 360, 370, and 380. Transfer modules 360, 370 and 380 are equipped with robots to move substrate 355 from one process area to another process area. The process area could be a substrate cassette, a reactor, or a loadlock. Substrate transfer module 360 is operated under lab ambient. Module 360 interfaces with substrate loaders (or substrate cassettes) 361 to bring the substrate 355 into the integrated system or to return the substrate to one of the cassettes 361.

As described above in process flow 300, the substrate 355 is brought to the integrated system 350 to deposit barrier layer and copper layer. As described in step 301 of process flow 300, top tungsten surface 124a of contact 125 is etched to remove native tungsten oxide. Once the tungsten oxide is removed, the exposed tungsten surface 124a of FIG. 2A needs to be protected from exposure to oxygen. If the removal process is an Ar sputtering process, the reactor 371 is coupled to the vacuum transfer module 370. If a wet chemical etching process is selected, the reactor should be coupled to the controlled-ambient transfer module 380, not the lab-ambient transfer module 360, to limit exposure of the tungsten surface to oxygen.

Afterwards, the substrate is deposited with a metallic barrier layer, such as Ta, TaN, Ru, or a combination of these films, as described in step 303 of FIG. 3A. The barrier layer 130 of FIG. 2B can be deposited by an ALD process or a PVD process. In one embodiment, the ALD process is operated at less than 1 Torr. The ALD reactor 373 is coupled to the vacuum transfer module 370. In another embodiment, the deposition process is a high-pressure process using supercritical $CO_2$ and organo-metallic precursors to form the metal barrier. In yet another embodiment, the deposition process is a physical vapor deposition (PVD) process operating at pressures less than 1 Torr. Details of an exemplary reactor for a high-pressure process using supercritical $CO_2$ is described in commonly assigned application Ser. No. 10/357,664, titled "Method and Apparatus for Semiconductor Wafer Cleaning Using High-Frequency Acoustic Energy with Supercritical Fluid", filed on Feb. 3, 2003, which in incorporated herein for reference.

The substrate can undergo an optional reduction (hydrogen-plasma treatment) process, for example using a hydrogen-containing plasma, as described in step 305 of FIG. 3A. The hydrogen reduction reactor 374 can be coupled to the vacuum transfer module 370. At this stage, the substrate is ready for electroless copper deposition. The electroless copper plating can be performed in an electroless copper deposition (copper-plating) reactor 381 to deposit a conformal seed layer. Following the seed layer deposition, copper bulk fill can be performed in the same electroless copper deposition reactor 381 used to deposit the conformal seed layer, but with a different chemistry to achieve bulk fill. Alternatively, copper bulk fill can be performed in a separate ECP reactor 381'.

Before the substrate leaves the integrated system 350, the substrate can optionally undergo a surface cleaning process, which can clean residues from the previous copper deposition process. For example, the substrate cleaning process can be brush clean process. Substrate cleaning reactor 383 can be integrated with the controlled-ambient transfer module 380. Alternatively, the substrate-cleaning reactor 383 can also be integrated with the lab-ambient transfer module 360. Alternatively, the barrier layer 130 of FIG. 2B can be deposited in a process chamber before the substrate 200 is brought into a system for surface treatment and depositing copper. As discussed above, the process flow 300 described in FIG. 3A and system 350 described in FIG. 3B can also be used to deposit barrier layer and copper for dual damascene structures, as shown in FIGS. 1A-1D, or other applicable interconnect structures. For dual damascene structures, step 301 in flow 300 is replaced by cleaning top surface of metal line, which is shown as surface 122a of FIG. 1A.

As described above, EM performance is affected by the quality of adhesion between copper and the barrier layer. In one embodiment, chemical-grafting chemicals that would selectively bond to conducting or semi-conducting clean surfaces to form a self-assembled monolayer (SAM) of such chemicals on the conducting or semi-conducting clean surfaces. The electro-grafting or chemical-grafting chemical, which is a complexing group and forms a monolayer on a conducting or a semiconducting surface, functionalizes the substrate surface to be deposited with a layer of material over the monolayer with strong bonding between the monolayer and the deposited layer material. Therefore, the monolayer can also be called a functinalization layer. From hereon, the terms self-assembled monolayer and functionalization layer are used interchangeably. Alternatively, the monolayer can be replaced by the deposited material during deposition process. The deposited material forms strong bonding directly with the substrate. The complexing group has one end that forms a covalent bond with the conducting or semiconducting surface. Using Ta as an example of barrier metal for copper interconnect, the complexing group of the funcationalization layer has one end forming a strong bond with Ta and another end forming a strong bond with copper, or can be modified to a catalytic site that will bond with copper. For SAM formed by chemical grafting, the chemical-grafting molecules are adsorbed by physisorption and chemisorption from the solution onto solid substrates to bond with the surface and to form ordered and a molecular functionalization layer, which is a self-assembled monolayer.

Figure 4A:
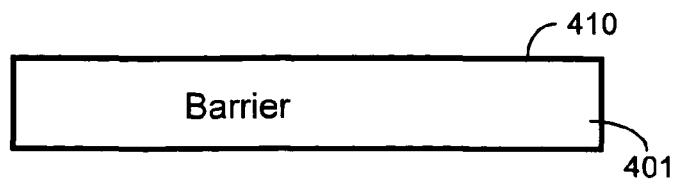
FIGS. 4A-4D show cross sections of a metal line structure at various stages of interconnect processing to incorporate a functionalization layer.
Figure 4B:
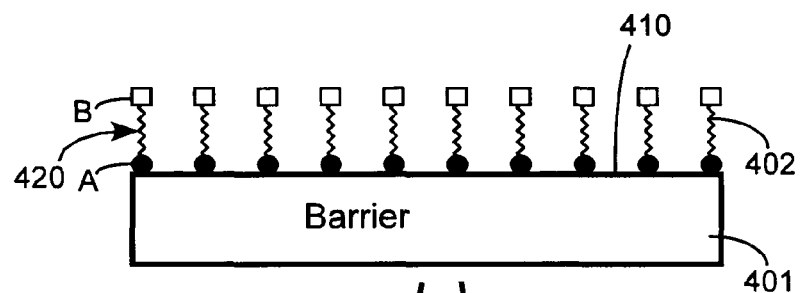
Figure 4C:
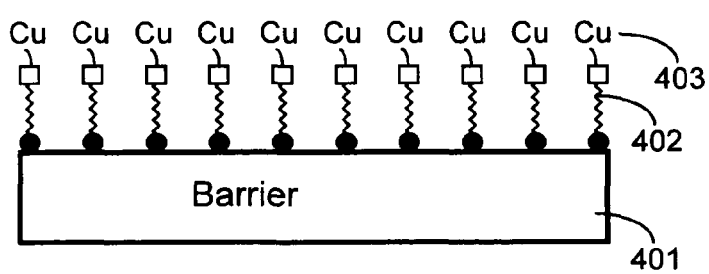
Figure 4D:
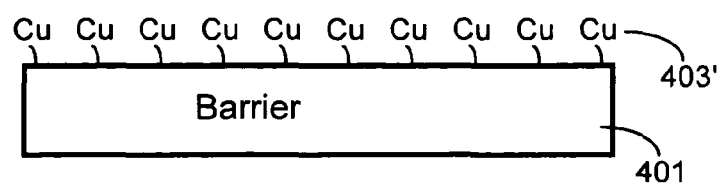

FIG. 4A shows a barrier layer 401 with a barrier surface 410. FIG. 4B shows that the barrier surface 410 is deposited with a functionalization layer 402 of the chemical-grafting complexing group 420. The complexing group 420 has two ends, "A" end and "B" end. "A" end forms a covalent bond with the surface 410 with barrier metal. The complexing group 420 should have an "A" end that would form a covalent bond with the barrier surface, which could be made of materials, such as Ta, TaN, Ru, or other application materials. In one embodiment, the "B" end form a covalent bond with the copper seed layer 403, as shown in FIG. 4C. In such embodiment, the "B" end of the complexing group 420 should choose a compound that would form a covalent bond with copper. Alternatively, copper 403' replaces the entire complexing group 420 to deposit directly on the barrier surface, as shown in FIG. 4D. or can be modified to a catalytic site that will bond with copper. The complexing group 420 in the FIG. 4D assist the copper in bonding to the barrier surface.

In one embodiment, the "A"-end of the chemical-grafting complexing group is a Lewis acid that interacts (or grafts) with a Lewis base barrier surface to form a bond between the metal and the chemical-grafting chemical (or complexing group). Examples of chemical-grafting complexing (or functional) group includes thiols, silanes, alcohols, organic acids, amine, and pyrrole. Examples of thiols include alkanethiols, such as decanethiol and octadecanethiol, tetraphenylporphines, diphenyl disulfide, aromatic thioacetate, ruthenium (II) tris(2,2,prime-biphyridine) thiol, thiophenol, 4,4 prime-dithiodipyridine, naphthalene disulfide, and bis(2-anthraquinyl)disulfide. Examples of silanes include 3-mercaptoprophyl trimethoxysilane, γ-methacryloxypropyl triethoxysilane, perfluoroctanoxylprophy-dimethyl silane, alkyltrichlorosilane, and oxtadecylsiloxane. An example of alcohols includes octanol. Examples of organic acids include 22-mercapto-1-docosanoic acid, alkanephosphonic acids, and octadecanoic acid. An example of amine includes diaminododecane. Examples of pyrrole include n-phenylpyrrole, and 2,5-dithienylpyrrol triad. The "B" end should be functional groups that contain elements that selectively bond to Cu. Such elements include copper (Cu), cobalt (Co), and ruthenium (Ru).

Figure 5A:
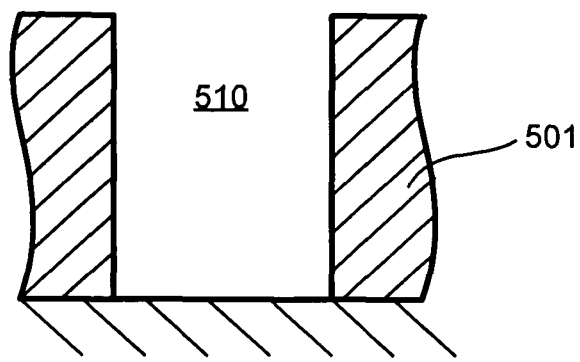
FIGS. 5A-5E show cross sections of an interconnect structure at various stages of interconnect processing to incorporate a functionalization layer.
Figure 5B:
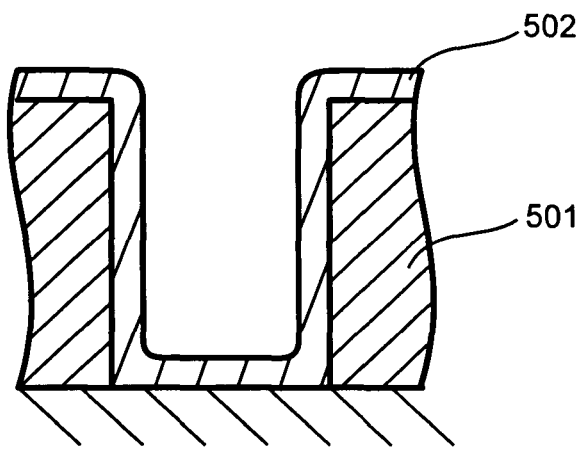
Figure 5C:
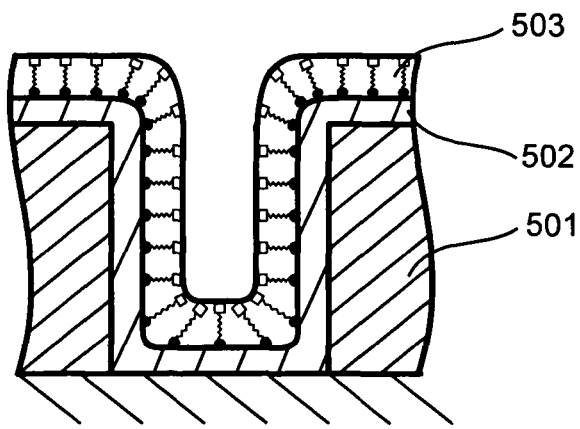
Figure 5D:
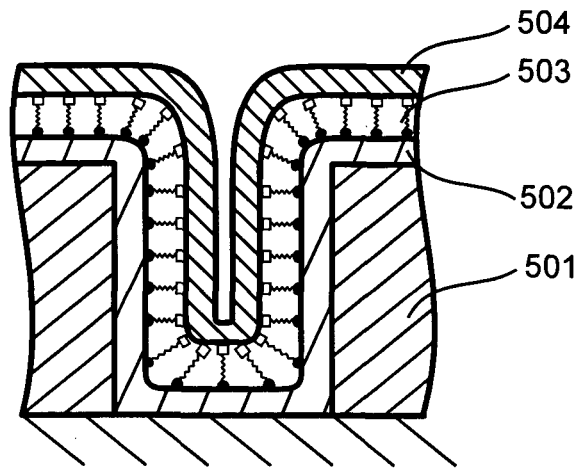
Figure 5E:
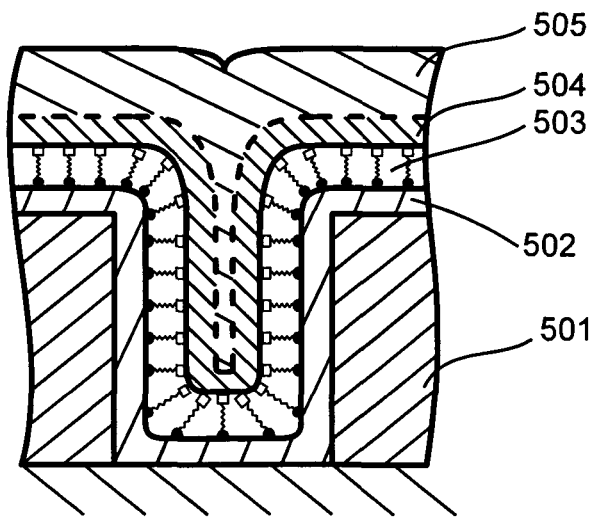

FIG. 5A shows an opening 510 of an interconnect metal structure (metal 1) that is surrounded by a dielectric layer 501. FIG. 5B shows that a barrier layer 502 is deposited to line the metal opening 510. The bottom of the metal structure is a contact, which is similar to the contact 125 shown in FIG. 2A-2C. The barrier layer can be deposited by ALD, PVD, or other applicable processes. The thickness of the barrier layer is between about 5 angstroms to about 300 angstroms. FIG. 5C shows that a functionalization layer 503 of chemical-grating complexing compound is deposited on barrier layer 502. In one embodiment, the thickness of the functionalization layer 503 is between about 5 angstroms to about 20 angstroms. After the functionalization layer 503 is deposited, a copper seed layer 504 is deposited over the functionalization layer 503, as shown in FIG. 5D. After copper seed layer 504 is deposited, copper gap-fill layer 505 is deposited, as shown in FIG. 5E.

Figure 6A:
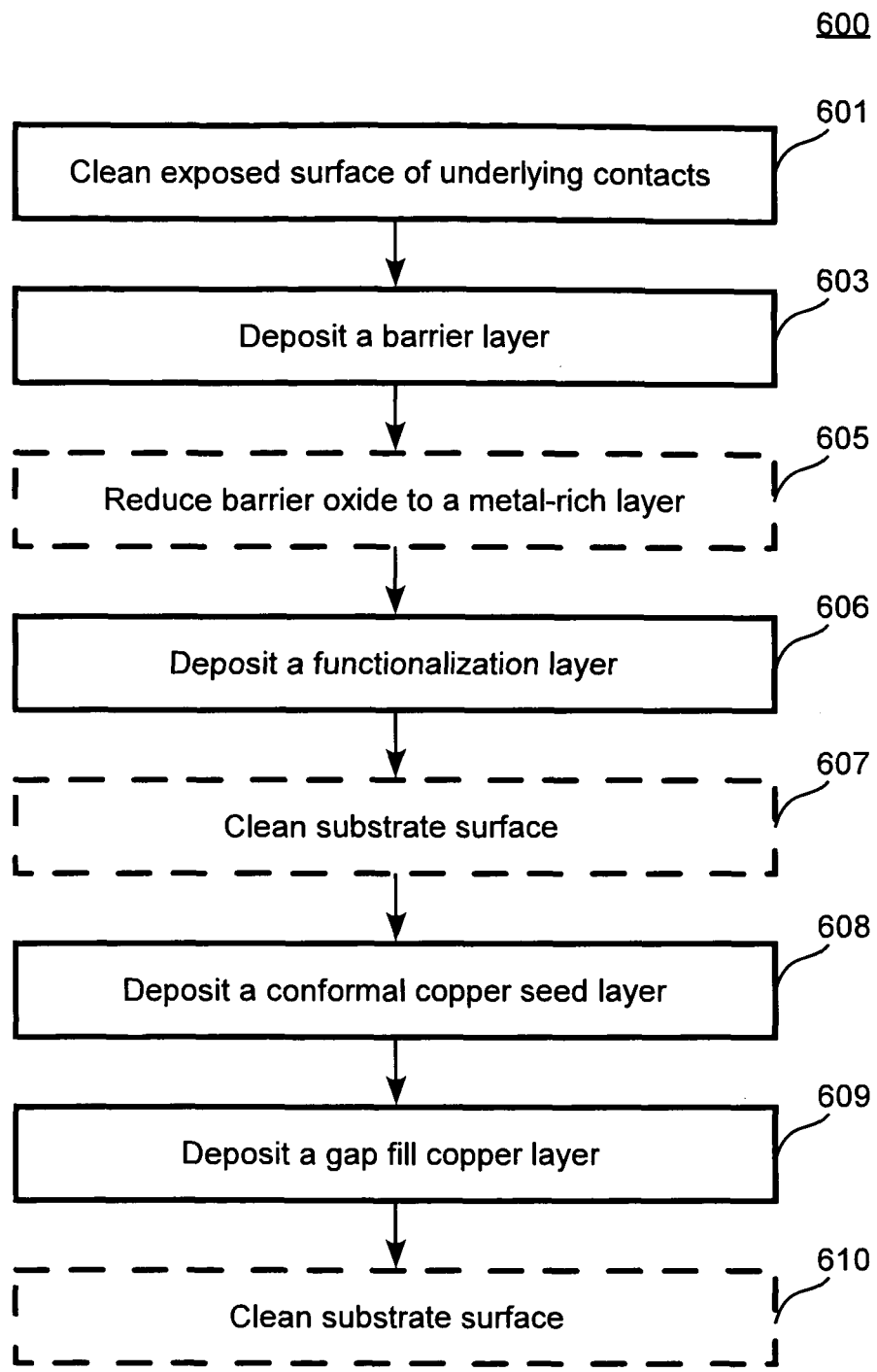
FIG. 6A shows an exemplary process flow of interconnect processing that incorporates a functionalization layer.

FIG. 6A shows an embodiment of a process flow of preparing the barrier (or liner) layer surface for electroless copper deposition. At step 601, the top surface 124a of contact 125 of FIG. 2A is cleaned to remove native metal oxide. Metal oxide can be removed by an Ar sputtering process or a wet chemical etch process. At step 603, a barrier layer is deposited in either an ALD or a PVD system. As described above, preventing the barrier layer from exposure to oxygen is critical in ensuring that electroless copper is being deposited on the barrier layer with good adhesion between copper and the barrier layer. Similarly, for the functionalization layer to be properly deposited on the barrier surface, the barrier surface should be removed of the barrier oxide. Once the barrier layer is deposited, the substrate should be transferred or processed in a controlled-ambient environment to limit exposure to oxygen. The barrier layer is treated by a reducing plasma (i.e. hydrogen-containing) at step 605 to produce a metal-rich layer that will provide a catalytic surface for the subsequent functionalization layer deposition step. The reducing plasma treatment is optional, depending on the composition of the surface. Afterwards, the substrate surface is deposited with a functionalization layer of chemical-grafting complexing compound at step 606. In one embodiment, the chemical-grafting complexing compound is mixed in a solution and the deposition process is a wet process. An optional clean step 607 after the deposition step at 606 may be needed.

Afterwards, a conformal copper seed is deposited on the barrier surface at step 608, followed by a thick copper bulk fill (or gap fill) process, 609. The conformal copper seed layer can be deposited by an electroless process. The thick copper bulk fill (also gap fill) layer can be deposited by an ECP process. Alternatively, the thick bulk fill (also gap fill) layer can be deposited by an electroless process in the same electroless system for conformal copper seed, but with a different chemistry.

After the substrate is deposited with conformal copper seed at step 608, and thick Cu bulk fill by either an electroless or electroplating process at step 609, the next process step 610 is an optional substrate-cleaning step to clean any residual contaminants from the previous electroless cobalt-alloy deposition.

FIG. 6B shows an embodiment of a schematic diagram of an integrated system 650 that allows minimal exposure of substrate surface to oxygen at critical steps after barrier and copper surface preparation. In addition, since it is an integrated system, the substrate is transferred from one process station immediately to the next process station, which limits the duration that clean copper surface is exposed to low levels of oxygen. The integrated system 650 can be used to process substrate(s) through the entire process sequence of flow 600 of FIG. 6A.

The integrated system 650 has 3 substrate transfer modules 660, 670, and 680. Transfer modules 660, 670 and 680 are equipped with robots to move substrate 655 from one process area to another process area. The process area could be a substrate cassette, a reactor, or a loadlock. A common path 687 is shown along which the substrate may travel. Substrate transfer module 660 is operated under lab ambient. Module 660 interfaces with substrate loaders (or substrate cassettes) 661 to bring the substrate 655 into the integrated system or to return the substrate to one of the cassettes 661.

As described above in process flow 600 of FIG. 6A, the substrate 655 is brought to the integrated system 650 to deposit barrier layer, to prepare barrier surface for copper layer deposition. As described in step 601 of process flow 600, top contact surface 124a of contacts 125 is etched to remove native metal oxide. Once the metal oxide is removed, the exposed tungsten surface 124a of FIG. 2A needs to be protected from exposure to oxygen. If the removal process is an Ar sputtering process, the Ar sputtering reactor 671 is coupled to the vacuum transfer module 670. If a wet chemical etching process is selected, the reactor should be coupled to the controlled-ambient transfer module 680, not the lab-ambient transfer module 660, to limit the exposure of the clean tungsten surface to oxygen. For a wet process to be integrated in a system with controlled processing and transporting environment, the reactor needs to be integrated with a rinse/dryer to enable dry-in/dry-out process capability. In addition, the system needs to be filled with inert gas to ensure minimal exposure of the substrate to oxygen.

Afterwards, the substrate is deposited with the barrier layer. The barrier layer 130 of FIG. 2B can be deposited by a PVD or an ALD process. In one embodiment, the barrier layer 130 is deposited by an ALD process, which is a dry process and is operated at less than 1 Torr. The ALD reactor 672 is coupled to the vacuum transfer module 670. The substrate can undergo an optional hydrogen reduction process to ensure the barrier layer surface is metal-rich for functionalization layer deposition. The hydrogen reduction reactor 674 can be coupled to the vacuum transfer module 670. At this stage, the substrate is ready for chemical-grafting complexing compound functionalization layer deposition. As described above, in one embodiment, this process is a wet process and can be deposited in a chemical-grafting complexing compound deposition chamber 683, coupled to the controlled-ambient transfer module 680. In one embodiment, chamber 683 is integrated a cleaning module (not shown) to clean the substrate 655 after the functionalization layer deposition. In another embodiment, substrate 655 undergoes an optional substrate cleaning step 607, as described in process flow 600. The substrate cleaning process can be a brush clean process, whose reactor 685 can be integrated with the controlled-ambient transfer module 680. After the substrate surface cleaning, substrate 655 is ready for copper seed layer deposition, as described in step 608 of flow 600. In one embodiment, the copper seed layer deposition is performed by an electroless process. The electroless copper plating can be performed in an electroless copper plating reactor 681 to deposit a conformal copper seed layer, as described in step 608 of FIG. 6A. As described above, the deposition of the gap fill copper layer at step 609 of FIG. 6A can be deposited in the same electroless plating reactor 681 with different chemistry, or in a separate ECP reactor 681'.

Before the substrate leaves the integrated system 650, the substrate can optionally undergoes a surface cleaning process, which can clean residues from the previous copper plating process. The substrate cleaning process can be brush clean process, whose reactor 663 can be integrated with the lab-ambient transfer module 660.

The wet processing systems described in FIG. 6B, which are coupled to the controlled-ambient transfer module 680, all need to meet the requirement of dry-in/dry-out to allow system integration. In addition, the systems are filled with one or more inert gases to ensure minimal exposure of the substrate to oxygen.

The process flow 600 described in FIG. 6A and system 650 described in FIG. 6B can be used to deposit barrier layer and copper for dual damascene structures, as shown in FIGS. 1A-1D. For dual damascene structures, step 601 in flow 600 is replaced by cleaning top surface of metal line, which is shown as surface 122a of FIG. 1A.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of preparing a substrate surface of a substrate to deposit a functionalization layer over a metallic barrier layer of a copper interconnect to assist deposition of a copper layer in the copper interconnect in an integrated system configured to operate a mixture of dry and wet processes in order to improve electromigration performance of the copper interconnect, comprising:

depositing the metallic barrier layer to line the copper interconnect structure by a dry process in the integrated system configured to operate a mixture of dry and wet processes, wherein after depositing the metallic barrier layer, the substrate is transferred and processed in a controlled environment in the integrated system to prevent the formation of metallic barrier oxide, the controlled environment defined by a vacuum transfer module coupled to one or more dry process chambers and a controlled-ambient transfer module coupled to one or more wet process chambers, the vacuum transfer module and the controlled-ambient transfer module being coupled to each other by a single load lock so as to form a common path for the substrate to directly travel between the vacuum transfer module and the controlled-ambient transfer module;

transporting the substrate from the vacuum transfer module to the controlled-ambient transfer module;

depositing the functionalization layer over the metallic barrier layer by a wet process in the integrated system; and depositing the copper layer over the functionalization layer in the copper interconnect structure by a wet process in the integrated system after the functionalization layer is deposited over the metallic barrier layer, wherein the material used for the functionalization layer comprises a complexing group with at least two ends, one end of the complexing group forming a bond with the metallic barrier layer and another end of the complexing group forming a bond with the copper layer, wherein the functionalization layer between the metallic barrier layer and the copper layer enables the deposition of the copper layer and improves adhesion between the metallic barrier layer and the copper layer;

wherein the transfer modules transfer the substrate in a dry state from one process chamber to a next process chamber, wherein ambient conditions are controlled during the transfers in the transfer modules.

2. The method of claim 1, further comprising:

cleaning an exposed surface of a underlying metal to the copper interconnect to remove a surface metal oxide of the exposed surface of a underlying metal in the integrated system before depositing the metallic barrier layer, wherein the underlying metal is part of an underlying interconnect electrically connected to the copper interconnect.

3. The method of claim 1, further comprising:

reducing a surface of the metallic barrier layer to make the surface of the metallic barrier layer metal-rich in the integrated system before depositing the functionalization layer.

4. The method of claim 1, wherein the material of the metallic barrier layer is selected from the group consisting of tantalum nitride (TaN), tantalum (Ta), Ruthenium (Ru), titanium (Ti), tungsten (W), zirconium (Zr), hafnium (Hf), molybdenum (Mo), niobium (Nb), vanadium (V), ruthenium (Ru) and chromium (Cr), and a hybrid combination of these materials.

5. The method of claim 1, wherein the complexing group is selected from the group consisting of decanethiol, octadecanethiol, tetraphenylporphines, diphenyl disulfide, aromatic thioacetate, ruthenium (II) tris(2, 2, prime-biphyridine) thiol, thiophenol, 4, 4 prime-dithiodipyridine, naphthalene disulfide, and bis(2-anthraquinyl) disulfide, 3-mercaptoprophyl trimethoxysilane, γ-methacryloxypropyl triethoxysilane, perfluoroctanoxylprophy-dimethyl silane, alkyltrichlorosilane, oxtadecylsiloxane, octanol, 22-mercapto-1-docosanoic acid, alkanephosphonic acids, octadecanoic acid, diaminododecane, n-phenylpyrrole, and 2,5-dithienylpyrrol triad.

6. The method of claim 3, wherein reducing the surface of the metallic barrier layer is performed by using a hydrogen-containing plasma.

7. The method of claim 1, wherein the copper interconnect is over an underlying interconnect which includes a metal line.

8. The method of claim 1, wherein the copper interconnect is over an underlying interconnect which includes a contact.

9. The method of claim 2, wherein cleaning the exposed surface of the surface metal oxide is accomplished by using one of an Ar sputtering process or a plasma process using a fluorine-containing gas.

10. The method of claim 9, wherein the fluorine-containing gas is $NF_3$, $CF_4$, or a combination of both.

11. The method of claim 1, wherein depositing the metallic barrier layer further comprising:
depositing a first metallic barrier layer; and
depositing a second metallic barrier layer.

12. The method of claim 11, wherein the first metallic barrier layer is deposited by an atomic layer deposition (ALD) process and the second metallic barrier layer is deposited by a physical vapor deposition (PVD) process.

13. The method of claim 11, wherein the first metallic barrier layer is deposited by an ALD process and the second metallic barrier layer is deposited by an ALD process.

14. The method of claim 1, further comprising:
cleaning a surface of the functionalization layer in the integrated system before depositing the copper layer.

15. The method of clam 1, wherein the copper layer is a thin copper seed layer selectively deposited by an electroless process.

16. The method of claim 15, wherein a gap-fill copper layer is deposited following the deposition of the thin copper seed layer by an electrochemical plating (ECP) process.

17. A method of preparing a substrate surface of a substrate to deposit a functionalization layer over a metallic barrier layer of a copper interconnect to assist deposition of a copper layer in the copper interconnect in an integrated system configured to operate a mixture of dry and wet processes in order to improve electromigration performance of the copper interconnect, comprising:
cleaning an exposed surface of a underlying metal to the copper interconnect to remove a surface metal oxide of the exposed surface of a underlying metal in the integrated system configured to operate a mixture of dry and wet processes before depositing the metallic barrier layer, wherein the underlying metal is part of an underlying interconnect electrically connected to the copper interconnect;
depositing the metallic barrier layer to line the copper interconnect structure by a dry process in the integrated system, wherein after depositing the metallic barrier layer, the substrate is transferred and processed in a controlled environment in the integrated system to prevent the formation of metallic barrier oxide, the controlled environment defined by a vacuum transfer module coupled to one or more dry process chambers and a controlled-ambient transfer module coupled to one or more wet process chambers, the vacuum transfer module and the controlled-ambient transfer module being coupled to each other by a single load lock so as to form a common path for the substrate to travel between the vacuum transfer module and the controlled-ambient transfer module;
reducing a surface of the metallic barrier layer to make the surface of the metallic barrier layer metal-rich in the integrated system before depositing the functionalization layer;
transporting the substrate from the vacuum transfer module to the controlled-ambient transfer module;
depositing the functionalization layer over the metallic barrier layer by a wet process in the integrated system; and
depositing the copper layer over the functionalization layer in the copper interconnect structure by a wet process in the integrated system after the functionalization layer is deposited over the metallic barrier layer, wherein the material used for the functionalization layer comprises a complexing group with at least two ends, one end of the complexing group forming a bond with the metallic barrier layer and another end of the complexing group forming a bond with copper, wherein the functionalization layer between the metallic barrier layer ad the copper layer enables the deposition of the copper layer and improves adhesion between the metallic barrier layer and the copper layer;
wherein the transfer modules transfer the substrate in a dry state from one process chamber to a next process chamber so as to limit exposure to oxygen.

18. The method of claim 17, wherein the material of the metallic barrier layer is selected from the group consisting of tantalum nitride (TaN), tantalum (Ta), Ruthenium (Ru), titanium (Ti), tungsten (W), zirconium (Zr), hafnium (Hf), molybdenum (Mo), niobium (Nb), vanadium (V), ruthenium (Ru) and chromium (Cr), and a hybrid combination of these materials.

19. The method of claim 17, wherein the complexing group is selected from the group consisting of decanethiol, octadecanethiol, tetraphenylporphines, diphenyl disulfide, aromatic thioacetate, ruthenium (II) tris(2, 2, prime-biphyridine) thiol, thiophenol, 4, 4 prime-dithiodipyridine, naphthalene disulfide, and bis(2-anthraquinyl) disulfide, 3-mercaptoprophyl trimethoxysilane, γ-methacryloxypropyl triethoxysilane, perfluoroctanoxylprophy-dimethyl silane, alkyltrichlorosilane, oxtadecylsiloxane, octanol, 22-mercapto-1-docosanoic acid, alkanephosphonic acids, octadecanoic acid, diaminododecane, n-phenylpyrrole, and 2,5-dithienylpyrrol triad.

20. The method of claim 17, wherein reducing the surface of the metallic bather layer is performed by using a hydrogen-containing plasma.

21. The method of claim 17, wherein the copper interconnect is over an underlying interconnect which includes a metal line.

22. The method of claim 17, wherein the copper interconnect is over an underlying interconnect which includes a contact.

23. The method of claim 17, wherein cleaning the exposed surface of the surface metal oxide is accomplished by using one of an Ar sputtering process or a plasma process using a fluorine-containing gas.

24. The method of claim 23, wherein the fluorine-containing gas is $NF_3$, $CF_4$, or a combination of both.

25. The method of claim 17, wherein depositing the metallic barrier layer further comprising:
depositing a first metallic barrier layer; and
depositing a second metallic barrier layer.

26. The method of claim 25, wherein the first metallic barrier layer is deposited by an atomic layer deposition (ALD) process and the second metallic barrier layer is deposited by a physical vapor deposition (PVD) process.

27. The method of claim 25, wherein the first metallic barrier layer is deposited by an ALD process and the second metallic barrier layer is deposited by an ALD process.

28. The method of claim 17, further comprising:
cleaning a surface of the functionalization layer in the integrated system before depositing the copper layer.

29. The method of clam 17, wherein the copper layer is a thin copper seed layer selectively deposited by an electroless process.

30. The method of claim 29, wherein a gap-fill copper layer is deposited following the deposition of the thin copper seed layer by an electrochemical plating (ECP) process.

* * * * *